(12) United States Patent
Suzuki et al.

(10) Patent No.: US 8,158,026 B2
(45) Date of Patent: Apr. 17, 2012

(54) METHOD FOR PREPARING β-SIALON PHOSPHOR

(75) Inventors: Hideo Suzuki, Gyunggi-do (KR); Chul Soo Yoon, Gyunggi-do (KR); Hyong Sik Won, Gyunggi-do (KR); Jeong Ho Ryu, Gyunggi-do (KR); Youn Gon Park, Gyunggi-do (KR); Sang Hyun Kim, Seoul (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 383 days.

(21) Appl. No.: 12/470,046

(22) Filed: May 21, 2009

(65) Prior Publication Data

US 2010/0038590 A1 Feb. 18, 2010

(30) Foreign Application Priority Data

Aug. 12, 2008 (KR) ........................ 10-2008-0079013

(51) Int. Cl.
C09K 11/64 (2006.01)
C09K 11/59 (2006.01)
(52) U.S. Cl. ................................. 252/301.4 F
(58) Field of Classification Search ............. 252/301.4 F
See application file for complete search history.

(56) References Cited

U.S. PATENT DOCUMENTS

| 7,815,817 | B2 * | 10/2010 | Hirosaki ................ 252/301.4 F |
| 2006/0045832 | A1 | 3/2006 | Nagatomi et al. |
| 2007/0108896 | A1 | 5/2007 | Hirosaki |
| 2007/0248519 | A1 | 10/2007 | Mitomo et al. |
| 2007/0257231 | A1 | 11/2007 | Hirosaki |
| 2008/0297031 | A1 * | 12/2008 | Takahashi et al. ............ 313/503 |
| 2010/0219741 | A1 | 9/2010 | Kawasaki et al. |
| 2011/0121234 | A1 * | 5/2011 | Hirosaki ................ 252/301.4 F |

FOREIGN PATENT DOCUMENTS

| EP | 1 964 905 A1 | 9/2008 |
| JP | 60-206889 | 10/1985 |
| JP | 2002-363554 | 12/2002 |
| JP | 2003-336059 | 11/2003 |
| JP | 2004-238505 | 8/2004 |
| JP | 2004-277663 A | 10/2004 |
| JP | 2005-255895 | 9/2005 |
| JP | 2005-272484 A | 10/2005 |
| JP | 2005-272486 A | 10/2005 |
| JP | 2006-45271 A | 2/2006 |
| JP | 2006-186278 | 7/2006 |
| JP | 2007-031201 | 2/2007 |
| JP | 2007-145919 A | 6/2007 |
| JP | 2007-308593 A | 11/2007 |
| JP | 2007-326981 A | 12/2007 |
| JP | 2007-332324 A | 12/2007 |
| WO | WO 2005/019376 A1 | 3/2005 |
| WO | WO 2006/016711 A1 | 2/2006 |
| WO | WO 2007/066733 | * 6/2007 |
| WO | WO 2007/066733 A1 | 6/2007 |

OTHER PUBLICATIONS

International Preliminary Report on Patentability, with English translation, issued in International Patent Application No. PCT/KR2009/004512, mailed Dec. 2, 2010.
Korean Office Action, w/ English translation thereof, issued in Korean Patent Application No. KR 10-2009-0074275 dated Apr. 29, 2011.
Japanese Notice of Information Provision issued in Japanese Patent Application No. JP 2009-134425 dated Jun. 22, 2010.
International Search Report issued in International Application No. PCT/KR2009/004512 dated Mar. 5, 2010.
Korean Office Action, and English translation thereof, issued in Korean Patent Application No. 10-2009-0074275 dated Dec. 12, 2011.
Japanese Office Action, w/ English translation thereof, issued in Japanese Patent Application No. 2009-134425, dated Feb. 21, 2012.

* cited by examiner

Primary Examiner — Carol M Koslow
(74) Attorney, Agent, or Firm — McDermott Will & Emery LLP

(57) ABSTRACT

There is provided a method for preparing a β-SiAlON phosphor capable of be controlled to show characteristics such as high brightness and desired particle size distribution. The method for preparing a β-SiAlON phosphor represented by Formula: $Si_{(6-x)}Al_xO_yN_{(6-y)}:Ln_z$ (wherein, Ln is a rare earth element, and the following requirements are satisfied: $0<x\leq4.2$, $0<y\leq4.2$, and $0<z\leq1.0$) includes: mixing starting materials to prepare a raw material mixture; and heating the raw material mixture in a nitrogen-containing atmospheric gas, wherein the starting materials includes a host raw material including a silicon raw material including metallic silicon, and at least one aluminum raw material selected from the group consisting of metallic aluminum and aluminum compound, and at least activator raw material selected from the rare earth elements for activating the host raw material.

8 Claims, 2 Drawing Sheets ern Patent Application No. 2008-79013 filed on Aug. 12, 2008, in the...

METHOD FOR PREPARING β-SIALON PHOSPHOR

CROSS-REFERENCE TO RELATED APPLICATIONS

This application claims the priority of Korean Patent Application No. 2008-79013 filed on Aug. 12, 2008, in the Korean Intellectual Property Office, the disclosure of which is incorporated herein by reference.

BACKGROUND OF THE INVENTION

1. Field of the Invention

The present invention relates to a method for preparing a β-SiAlON phosphor, and more particularly, to a method for preparing a β-SiAlON phosphor capable of be controlled to show characteristics such as high brightness and desired particle size distribution.

2. Description of the Related Art

SiAlON phosphors are a kind of oxynitride phosphors including chemical elements such as Si, Al, O and N, and it has been known that there are two kinds of the SiAlON phosphors having different crystal structures: α-SiAlON phosphor and β-SiAlON phosphor. The α-SiAlON phosphor is described in non-patent reference 1, and the α-SiAlON phosphor and the use of LED using the same are described in patent references 1 to 4. Also, the β-SiAlON phosphor is described in patent reference 5, and the β-SiAlON phosphor and the use of LED using the same are described in patent reference 6.

[Non-patent reference 1] J. W. H. van Krebel "On new rare earth doped M—Si—Al—O—N materials", Tu Eindhoven The Netherland, P145-161 (1998)

[Patent reference 1] Japanese Laid-Open Patent Publication No. 2002-363554

[Patent reference 2] Japanese Laid-Open Patent Publication No. 2003-336059

[Patent reference 3] Japanese Laid-Open Patent Publication No. 2004-238505

[Patent reference 4] Japanese Laid-Open Patent Publication No. 2007-31201

[Patent reference 5] Japanese Laid-Open Patent Publication No. Sho60-206889

[Patent reference 6] Japanese Laid-Open Patent Publication No. 2005-255895

α-SiAlON has a crystal structure having a unit structure represented by Formula: $Si_{12-(m+n)}Al_{(m+n)}O_nN_{16-n}$ and having two sites formed therein. Metal ions, such as $Ca^{2+}$ having a relatively smaller ion radius may be dissolved into the sites, and the metal ion-dissolved α-SiAlON may be represented by Formula: $M_{m/v}Si_{12-(m+n)}Al_{(m+n)}O_nN_{16-n}$:Eu (wherein, M is a metal ion, v represents a valence of the metal ion). It has been known that α-SiAlON in which Ca and an activator Eu are dissolved is a yellow-emitting phosphor, as described in the non-patent reference 1 and the patent reference 1. The α-SiAlON phosphor has an excitation wavelength band ranging from ultraviolet rays to blue light. Therefore, it was expected that the α-SiAlON phosphor will be used as a yellow-emitting phosphor for white LED since it is allowed to emit a yellow light when it is irradiated with the ultraviolet rays or blue light.

The yellow-emitting phosphor may be prepared by weighing europium oxide and starting materials such as silicon nitride, aluminum nitride and calcium carbonate ($CaCO_3$), all of which are used in the form of powder, mixing certain amounts of the europium oxide and the starting materials, and firing the resulting mixture at high temperature under a nitrogen-containing atmosphere. Also, there have been a proposal for a high-purity raw material in which a content of impurities is stipulated (Patent reference 3), or a proposal for the use of metallic silicon (Patent reference 4) in order to provide high brightness.

Meanwhile, it has been known that β-SiAlON has a crystal structure represented by Formula: $Si_{6-x}Al_xO_xN_{8-x}$, and has no large site formed in crystal thereof unlike the α-SiAlON. The patent references 5 and 6 disclose a β-SiAlON phosphor prepared by adding an activator to β-SiAlON. The patent reference 5 proposes a β-SiAlON phosphor using a metal element (i.e. Cu, Ag, or Mn) and a rare earth element (i.e. Eu) as the activator in β-SiAlON. Also, the Eu-activated β-SiAlON phosphors were reported in the patent references 5 and 6, respectively. However, it was reported that the Eu-activated β-SiAlON phosphor described in the patent reference 5 is allowed to emit light at a blue-emitting band of 410 to 440 nm, and the Eu-activated β-SiAlON phosphor described in the patent reference 6 is a green-emitting phosphor. From these results, it was supposed that the difference in emission colors of the Eu-activated β-SiAlON phosphors is derived from the fact that, since Eu-activated β-SiAlON phosphor of the patent reference 5 has a low firing temperature, Eu is not sufficiently dissolved into β-SiAlON, as described above in the patent reference 6.

The Eu-activated β-SiAlON phosphor of the patent reference 6 is characteristic of being exited to emit a green light when it was exposed to the light that is of an ultraviolet ray to a blue light range. Therefore, the Eu-activated β-SiAlON phosphor has received attention as a green-emitting phosphor for white LED that is composed of blue LED and a phosphor, or UV LED and a phosphor. In particular, it is expected that the Eu-activated β-SiAlON phosphor is used as a green-emitting phosphor for white LED requiring high color reproductions since it has a narrow spectrum width of approximately 55 nm and shows its good color purity. However, there is a demand for enhancing brightness of the Eu-activated β-SiAlON phosphor since the Eu-activated β-SiAlON phosphor shows its insufficient brightness.

The β-SiAlON phosphor is prepared by weighing starting materials such as silicon nitride and aluminum nitride and an activator, all of which are used in the form of powder, mixing certain amounts of the starting materials and the activator, and firing the resulting mixture at high temperature in a nitrogen-containing atmosphere. Also, the patent reference 6 discloses a method for preparing a Eu-activated β-SiAlON phosphor. Here, the Eu-activated β-SiAlON phosphor is prepared by weighing starting materials such as silicon nitride and aluminum nitride (or, aluminum oxide) and europium oxide, mixing certain amounts of the starting materials and the europium oxide, and firing the resulting mixture at a high temperature of 1850° C. or above in a nitrogen-containing atmosphere.

As described above, the conventional method, as described in the patent reference 6, using the recently known nitride raw materials such as silicon nitride and aluminum nitride as starting materials has a problem in that it is impossible to obtain a β-SiAlON phosphor having sufficiently high brightness. Also, when the conventional method is used in the field of applications such as white LED, it is necessary to control the particle size distribution such as particle sizes or particle shapes, in addition to the light-emitting characteristics of the β-SiAlON phosphor, so that the particle size distribution can affect luminous efficiency of the white LED device. Also, it is necessary to use a suitable β-SiAlON phosphor for the white LED device since the particle size distribution of the β-SiAlON phosphor affects a manufacturing ratio of the final products.

Furthermore, there are limits on the makers that are able to manufacture silicon nitride and/or aluminum nitride, and therefore kinds of high purity silicon nitride and/or high purity aluminum nitride used as the raw materials are not so much. As a result, there are limitations on the nitride raw materials used, that is, the nitride raw materials having sufficiently high purity are not present in common-grade products and/or the cost of the nitride raw materials is high. That is to say, in the case of the brightness and the particle size distribution depending on the kinds of the used nitride raw materials, the limitations on the nitride raw materials may cause the brightness to be deteriorated and the particle size distribution to be controlled insufficiently.

SUMMARY OF THE INVENTION

The present invention is designed to solve the problems of the prior art, and therefore it is an object of the present invention to provide a method for preparing a β-SiAlON phosphor capable of be controlled to show characteristics such as high brightness and desired particle size distribution.

According to an aspect of the present invention, there is provided a method for preparing a (β-SiAlON phosphor represented by Formula: $Si_{(6-x)}Al_xO_yN_{(8-y)}:Ln_z$ (wherein, Ln is a rare earth element, and the following requirements are satisfied: $0<x\leq4.2$, $0\leq y\leq4.2$, and $0<z\leq1.0$). Here, the method includes: mixing starting materials to prepare a raw material mixture; and heating the raw material mixture in a nitrogen-containing atmospheric gas, wherein the starting materials includes a host raw material including a silicon raw material including metallic silicon, and at least one aluminum raw material selected from the group consisting of metallic aluminum and aluminum compound, and at least one activator raw material selected from the rare earth elements for activating the host raw material. In this case, the rare earth element may include Eu or Ce.

Also, the silicon raw material may include metallic silicon and silicon compound, wherein the silicon compound includes at least one selected from the group consisting of silicon nitride and silicon oxide. Also, the aluminum compound may include at least one selected from the group consisting of aluminum nitride, aluminum oxide and aluminum hydroxide.

Additionally, the β-SiAlON phosphor may have a peak wavelength of 500 to 570 nm.

Furthermore, when the raw material mixture is heated, the nitrogen-containing atmospheric gas may have an $N_2$ concentration of 90% or more and a gas pressure of 0.1 to 20 MPa, and a heating temperature of the raw material mixture may be in a temperature range of 1850 to 22000 ° C.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
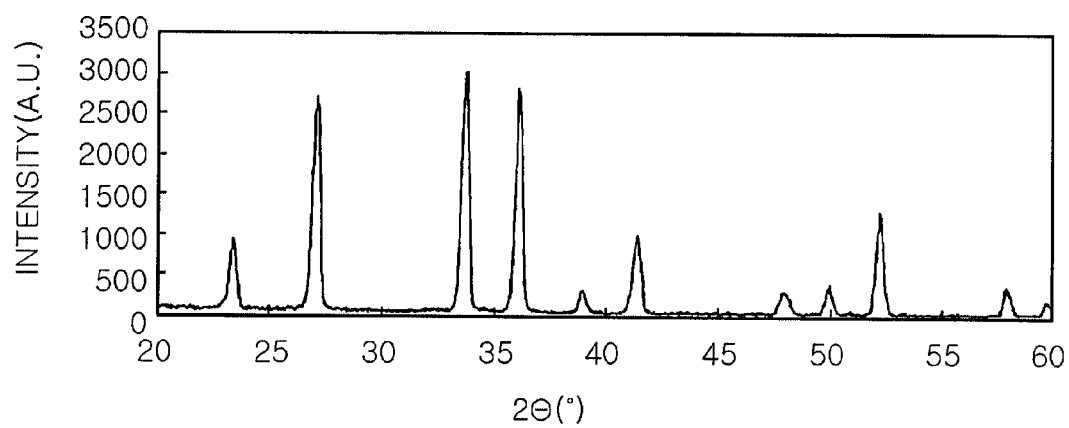
FIG. 1 is a graph illustrating an X-ray diffraction analysis result of a β-SiAlON phosphor prepared in Example 1.

Hereinafter, exemplary embodiments of the present invention will now be described in detail with reference to the accompanying drawings. However, it is apparent to those skilled in the art that modifications and variations may be made without departing from the scope of the invention. Therefore, the exemplary embodiments of the present invention will be provided for the purpose of better understanding of the present invention as apparent to those skilled in the art.

The method for preparing a β-SiAlON phosphor according to one exemplary embodiment of the present invention is characterized in that the β-SiAlON phosphor is represented by Formula: $Si_{(6-x)}Al_xO_yN_{(8-y)}:Ln_z$ (wherein, Ln is a rare earth element, and the following requirements are satisfied: $0<x\leq4.2$, $0\leq y\leq4.2$, and $0<z\leq1.0$). Here, the method according to one exemplary embodiment of the present invention includes: mixing starting materials to prepare a raw material mixture; and heating the raw material mixture in a nitrogen-containing atmospheric gas, wherein the starting materials includes a host raw material including a silicon raw material including metallic silicon, and at least one aluminum raw material selected from the group consisting of metallic aluminum and aluminum compound, and at least one activator raw material selected from the rare earth elements for activating the host raw material.

In accordance with one exemplary embodiment of the present invention, raw materials are mixed and heated in a nitrogen-containing atmospheric gas to prepare a β-SiAlON phosphor. Materials including silicon, aluminum, and an activator (i.e. rare earth metals) are used as the raw materials.

The silicon raw material includes raw materials including silicon. Here, only metallic silicon is used as the silicon raw material, or a silicon compound including other kinds of silicon in addition to the metallic silicon may be mixed and used as the silicon raw material. In this case, silicon nitride or silicon oxide may be used as the silicon compound.

The metallic silicon is preferably high-purity metallic silicon that is in the form of powder and has a low content of impurities such as Fe. In the case of the metallic silicon powder, its particle diameter or particle distribution does not directly affect a particle system of the β-SiAlON phosphor. However, the particle diameter or particle distribution of the metallic silicon powder affects the particle size distribution, such as particle sizes or particle shapes, of the β-SiAlON phosphor through the sintering conditions or a combination of the raw materials, and also affects emissions of the β-SiAlON phosphor. Therefore, a particle diameter of the metallic silicon powder is preferably 300 μm or less.

In terms of the reactivity, it is more preferred that the smaller the particle diameter of the metallic silicon is, the higher the reactivity of the metallic silicon is. However, since the characteristics such as the particle size distribution and emission may be affected by the mixed raw materials or the sintering rate, it is unnecessary for the metallic silicon to have a small particle diameter, and the metallic silicon is not limited to have a powdery shape.

The aluminum raw material that may be used herein includes at least one selected from the group consisting of metallic aluminum and aluminum compounds including aluminum. Also, the metallic aluminum and the aluminum compound may be used together. The aluminum compound including aluminum that may be used herein includes, for example, aluminum nitride, aluminum oxide, and aluminum hydroxide. When the metallic silicon is used as the silicon raw material, it is unnecessary to use the metallic aluminum as the aluminum raw material, but only the aluminum compound may be used as the silicon raw material.

When the metallic aluminum is used as the aluminum raw material, the metallic aluminum is preferably high-purity metallic aluminum that is in the form of powder and has a low content of impurities such as Fe. From the above-mentioned point of view, the metallic aluminum preferably has a particle diameter of 300 μm or less. However, since the characteristics such as the particle size distribution and emission may be affected by a combination of the raw materials or the sintering rate, it is unnecessary for the metallic aluminum to have a small particle diameter, and the metallic aluminum is not limited to have a powdery shape.

The activator raw material that may be used herein includes one rare earth metal selected from the group consisting of Eu, Ce, Sm, Yb, Dy, Pr and Tb. Specific examples of the activator raw material that may be used herein include oxides such as $Eu_2O_3$, $Sm_2O_3$, $Yb_2O_3$, CeO, $Pr_7O_{11}$ and $Tb_3O_4$; and $Eu(NO_3)_3$, and $EuCl_3$, etc. Preferably, the activator raw material may be Eu or Ce.

The particle size distribution of the β-SiAlON phosphor may be controlled by adjusting a mixing ratio of the silicon raw material and the aluminum raw material. In addition, the particle size distribution of the β-SiAlON phosphor may also be controlled by adjusting a mixing ratio of the metallic silicon and the silicon compound in the silicon raw material, or a mixing ratio of the metallic aluminum and the aluminum compound in the aluminum raw material. Effects of the raw material such as the metallic silicon or metallic aluminum are described in more detail in the following Examples.

The β-SiAlON phosphor prepared according to one exemplary embodiment of the present invention may be a phosphor represented by the following Formula 1.

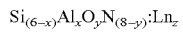  Formula 1

In the Formula 1, Ln is preferably a rare earth element, and the following requirements are preferably satisfied: $0<x\leq4.2$, $0<y\leq4.2$, and $0<z\leq1.0$). This β-SiAlON phosphor may be a green-emitting phosphor, and its peak wavelength may be in a range of 500 to 570 nm.

As described above, the β-SiAlON phosphor is prepared by weighing a silicon raw material including metallic silicon, an aluminum raw material including at least one of metallic aluminum and aluminum compound, and an activator including rare earth elements such as Eu, Sm, Yb, Ce, Pr and Tb, mixing the activator with the silicon raw material and the aluminum raw material, filling the resulting raw material mixture with a boron nitride crucible, and firing the raw material mixture under a nitrogen-containing atmosphere.

The raw material mixture reacts under a high-temperature nitrogen atmosphere to form a phosphor. Here, the nitrogen-containing atmospheric gas preferably has an $N_2$ concentration of 90% or more. Also, the nitrogen-containing atmospheric gas may have a gas pressure of 0.1 to 20 MPa. In order to form a nitrogen atmosphere, a boron nitride crucible is put under a vacuum and a nitrogen-containing atmospheric gas is then introduced into the boron nitride crucible. On the contrary, the nitrogen atmosphere may also be formed by introducing a nitrogen-containing atmospheric gas into a boron nitride crucible without putting the boron nitride crucible under a vacuum. In this case, it is possible to discontinuously introduce the nitrogen-containing atmospheric gas into the boron nitride crucible.

When the raw material mixture including metallic silicon is fired under a nitrogen atmosphere, nitrogen gas serves as a nitrogen source. Here, silicon is nitrized by reaction of nitrogen with the silicon, thus to form a SiAlON phosphor. In this case, since the silicon raw material, the aluminum raw material and the activator react together before or during the nitrization of the silicon, it is possible to prepare a SiAlON phosphor having a uniform composition. In this case, the prepared β-SiAlON phosphor has improved brightness.

In the firing operation, the raw material mixture is preferably heated at a high temperature of 1850 to 2200° C. Although the gas pressure and the firing temperature may be varied according to the compositions of the raw material mixture, the raw material mixture is preferably sintered at a gas pressure of 0.8 MPa or more and a high temperature of 1900 to 2100° C. to prepare a SiAlON phosphor having high brightness. Then, the heated raw material mixture may be ground into powder and or classified so as to control the particle size distribution. The ground raw material mixture may be re-fired at a high temperature.

Hereinafter, the β-SiAlON phosphor prepared by the method for preparing a β-SiAlON phosphor according to one exemplary embodiment of the present invention is described in more detail, as follows.

In the following Examples, a raw material mixture is prepared by weighing a silicon raw material and an aluminum raw material as the host raw materials and an activator and mixing certain amounts of the host raw materials and the activator in a ball mill or a mixer. The raw material mixture is put into a high-temperature, heat-resistant container such as a boron nitride (BN) crucible, and the BN crucible is loaded in an electric furnace that is able to be heated under a pressure or a vacuum. That is, a β-SiAlON phosphor is prepared by heating the raw material mixture to a temperature of 1800° C. or above at the rising speed of 20° C/min with a gas pressure of 0.2 to 2 MPa in the nitrogen-containing atmospheric gas.

The phosphors of Examples 1 to 9 were prepared by using the silicon raw materials containing the metallic silicon, the aluminum raw materials and activator raw materials by varying a mixing ratio of them, and the phosphors of Comparative examples 1 to 3 were prepared using the metallic silicon-free silicon raw material. Here, Eu compounds are used as activator raw materials, therefore all the phosphors are Eu-activated β-SiAlON phosphors and also green-emitting phosphors that have a peak wavelength of 520 to 560 nm.

EXAMPLE 1

Silicon nitride ($Si_3N_4$) and metallic silicon (Si) were used as the silicon raw material, alumina ($Al_2O_3$) was used as the aluminum raw material, and europium oxide ($Eu_2O_3$) was used as the activator. $Si_3N_4$, Si, $Al_2O_3$ and $Eu_2O_3$ were weighed, and 4.047 g of $Si_3N_4$, 5.671 g of Si, 0.589 g of $Al_2O_3$, and 0.141 g of $Eu_2O_3$ were mixed using a mixer and a sieve. Then, the prepared raw material mixture was put into a BN crucible, and the BN crucible that the raw material mixture was put into was loaded into a gas pressured electric furnace. Here, a firing operation was heated from room temperature to 500° C. under a vacuum at first step, and at the next step, an N2 gas was introduced into the electric furnace at 500° C., and at the next, the furnace was heated from 500 to 1950° C. at the rising speed of 5° C/min under an $N_2$ gas atmosphere, and then fired at 1950° C. for 5 hours at a constant gas pressure of 0.8 MPa or more.

The synthesized phosphor at a high temperature was cooled, extracted from the BN crucible of the electric furnace, and ground. Then, the ground phosphor was sieved through a 100-mesh sieve. This sieved phosphor was washed with hydrofluoric acid and hydrochloric acid, dispersed, dried sufficiently, and sieved through a 50-mesh sieve to obtain a phosphor of Example 1.

EXAMPLE 2

A β-SiAlON phosphor was prepared in the same manner as in Example 1, except for using 1.349 g of $Si_3N_4$ and 7.291 g of Si instead of 4.047 g of $Si_3N_4$, 5.671 g of Si.

EXAMPLE 3

A β-SiAlON phosphor was prepared in the same manner as in Example 1, except for using 6.744 g of $Si_3N_4$ and 4.051 g of Si instead of 4.047 g of $Si_3N_4$, 5.671 g of Si.

EXAMPLE 4

A β-SiAlON phosphor was prepared in the same manner as in Example 1, except for using 9.442 g of $Si_3N_4$ and 2.430 g of Si instead of 4.047 g of $Si_3N_4$, 5.671 g of Si.

EXAMPLE 5

A β-SiAlON phosphor was prepared in the same manner as in Example 1, except that only Si was used without the use of $Si_3N_4$ as the silicon raw material and 8.101 g of Si was used instead of 4.047 g of $Si_3N_4$, 5.671 g of Si Comparative Example 1

A β-SiAlON phosphor was prepared in the same manner as in Example 1, except that only 13.488 g of $Si_3N_4$ was used as the silicon raw material without the use of Si instead of 4.047 g of $Si_3N_4$, 5.671 g of Si.

EXAMPLE 6

Silicon nitride ($Si_3N_4$) and metallic silicon (Si) were used as the silicon raw material, aluminum nitride (AlN) was used as the aluminum raw material, and europium oxide ($Eu_2O_3$) was used as the activator. $Si_3N_4$, Si, AlN and $Eu_2O_3$ were weighed, and 5.395 g of $Si_3N_4$, 3.241 g of Si, 0.379 g of AlN and 0.137 g of $Eu_2O_3$ were mixed using a mixer and a sieve. Then, the prepared raw material mixture was put into a BN crucible, and the BN crucible was loaded into a gas pressured electric furnace. Here, the raw material mixture was fired by heating the raw material mixture to 1450 ° C. for 5 hours under a nitrogen atmosphere. Then, the fired product was cooled and ground, i.e. the $1^{st}$ fired products was obtained. The $1^{st}$ fired product was put into a BN crucible, and the BN crucible was then set in the gas pressured electric furnace. The furnace was heated to 500 ° C. under a vacuum, and an $N_2$ gas was introduced into the furnace at 500 ° C. Then the furnace temperature was heated from 500 to 2000 ° C. at a rising speed of 5 ° C/min under an $N_2$ gas atmosphere, and then fired at 2000 ° C. for 5 hours at a constant gas pressure of 0.8 MPa or more.

The phosphor that was fired at the high temperature was cooled, extracted from the BN crucible, and ground. Then, the ground phosphor was sieved through a 100-mesh sieve. And then was washed with hydrofluoric acid and hydrochloric acid, dispersed, dried sufficiently, and sieved through a 50-mesh sieve to obtain a phosphor of Example 6.

EXAMPLE 7

A β-SiAlON phosphor was prepared in the same manner as in Example 6, except for using 7.554 g of $Si_3N_4$ and 1.944 g of Si instead of 5.395 g of $Si_3N_4$ and 3.241 g of Si.

EXAMPLE 8

A β-SiAlON phosphor was prepared in the same manner as in Example 6, except that only Si was used without the use of $Si_3N_4$ as the silicon raw material, and 6.481 g of Si was used instead of 5.395 g of Si3N4 and 3.241 g of Si.

Comparative Example 2

A β-SiAlON phosphor was prepared in the same manner as in Example 6, except that only $Si_3N_4$ was used without the use of Si as the silicon raw material, and 10.791 g of $Si_3N_4$ was used instead of 5.395 g of $Si_3N_4$ and 3.241 g of Si.

EXAMPLE 9

A β-SiAlON phosphor was prepared in the same manner as in Example 6, except that 6.744 g of $Si_3N_4$ and 4.051 g of Si were used as the silicon raw materials, 0.312 g of metallic aluminum (Al) was only used as the aluminum raw material without the use of $Al_2O_3$ or AlN, and 0.172 g of $Eu_2O_3$ was used as the activator instead of the 5.395 g of $Si_3N_4$, 3.241 g of Si, 0.379 g of AlN and 0.137 g of $Eu_2O_3$.

Comparative Example 3

A β-SiAlON phosphor was prepared in the same manner as in Example 6, except that 13.488 g of $Si_3N_4$ was only used as the silicon raw material without the use of Si, 0.312 g of Al was used as the aluminum raw material and 0.172 g of $Eu_2O_3$ was used as the activator instead of the 5.395 g of $Si_3N_4$, 3.241 g of Si, 0.379 g of AlN and 0.137 g of $Eu_2O_3$.

Hereinafter, the mixing ratios of the raw materials used in the above-mentioned Examples and Comparative examples are listed in the following Table 1.

TABLE 1

| Ex. No. | $Si_3N_4$ (g) | Si (g) | $Al_2O_3$ (g) | AlN (g) | Al (g) | $Eu_2O_3$ (g) |
|---|---|---|---|---|---|---|
| Ex. 1 | 4.047 | 5.671 | 0.589 | — | — | 0.141 |
| Ex. 2 | 1.349 | 7.291 | 0.589 | — | — | 0.141 |
| Ex. 3 | 6.744 | 4.051 | 0.589 | — | — | 0.141 |
| Ex. 4 | 9.442 | 2.430 | 0.589 | — | — | 0.141 |
| Ex. 5 | — | 8.101 | 0.589 | — | — | 0.141 |
| Comp. ex. 1 | 13.488 | — | 0.589 | — | — | 0.141 |
| Ex. 6 | 5.395 | 3.241 | — | 0.379 | — | 0.137 |
| Ex. 7 | 7.554 | 1.944 | — | 0.379 | — | 0.137 |
| Ex. 8 | — | 6.481 | — | 0.379 | — | 0.137 |
| Comp. ex. 2 | 10.791 | — | — | 0.379 | — | 0.137 |
| Ex. 9 | 6.744 | 4.051 | — | — | 0.312 | 0.172 |
| Comp. ex. 3 | 13.488 | — | — | — | 0.312 | 0.172 |

The crystalline phase of the phosphor that was synthesized in Example 1 was identified by using powder X-ray diffraction (XRD), and these results are shown in FIG. 1. From FIG. 1 and JCPDS data, it was revealed that the synthesized phosphor is a β-SiAlON phosphor.

Figure 2:
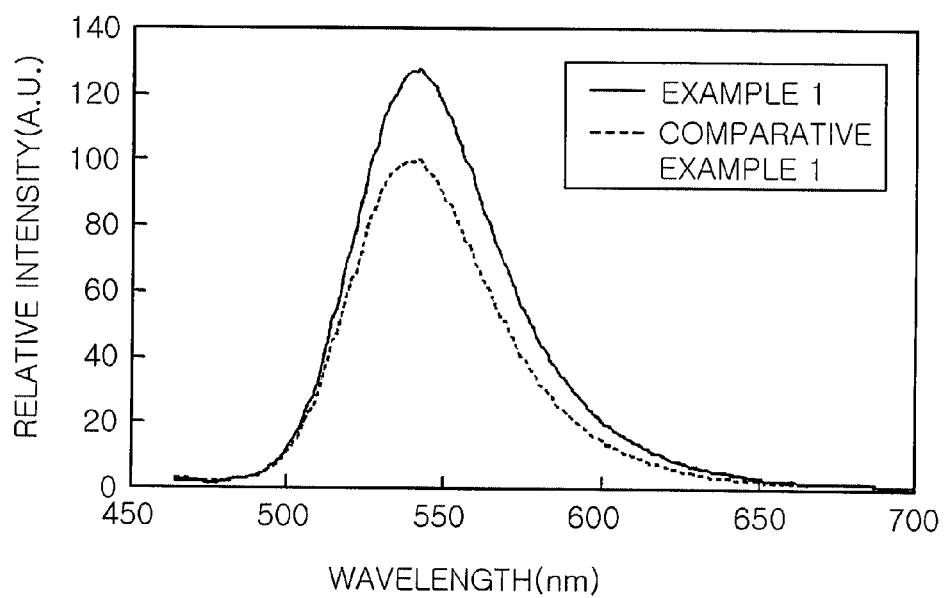
FIG. 2 is a graph illustrating an emission spectrum of the β-SiAlON phosphor prepared in Example 1.
Figure 3:
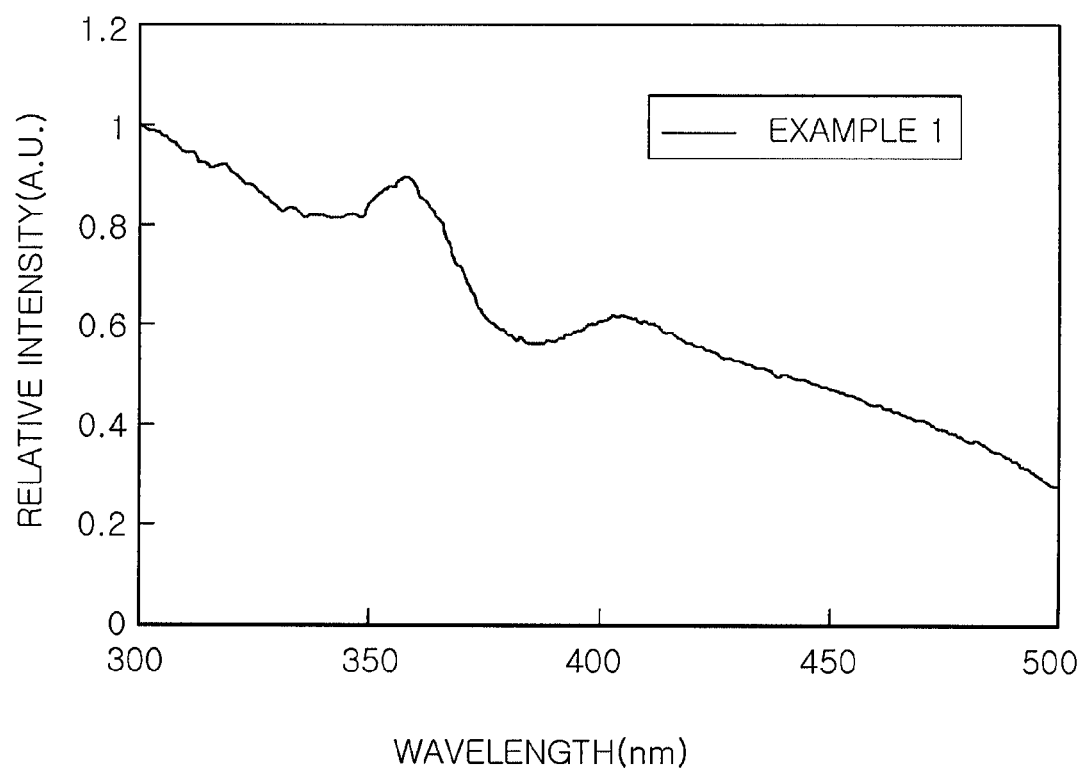
FIG. 3 is a graph illustrating an excitation spectrum of the β-SiAlON phosphor prepared in Example 1.

Also, emissions of the β-SiAlON phosphor were measured by irradiating the β-SiAlON phosphor with excitation light of 460 nm. Then, the emission spectrum results of the β-SiAlON phosphors of Example 1 and Comparative example 1 are shown in FIG. 2. The β-SiAlON phosphor of Example 1 was a green-emitting phosphor that shows its emission peak at 541 nm and full width of half maximum is 54.7 nm. Also, the brightness of the β-SiAlON phosphor of Example 1 was 27% higher than β-SiAlON phosphor of Comparative example 1. The excitation spectrum of the β-SiAlON phosphor prepared in Example 1 was measured at emission maxima wavelength of 541 nm as detection light. The results are shown in FIG. 3. From the above results, it was seen that the excitation spectrum of the β-SiAlON phosphor are observed at excitation wavelengths spanning from ultraviolet rays to visible rays in the vicinity of 500 nm.

7 Parts by weight of each of the β-SiAlON phosphors prepared in Examples 1 to 9 and Comparative examples 1 to 3, 3 parts by weight of a red $CaAlSiN_3$:Eu phosphor, and 10 parts by weight of silicon resin were mixed thoroughly to form slurry. Then, the slurry was injected into a cup on a mount lid equipped with a blue-emitting LED device, and then cured at 130° C. for 1 hour to prepare a white LED using the β-SiAlON phosphor. The prepared white LED was measured for brightness.

The emission peak wavelengths of the β-SiAlON phosphors prepared in Examples 1 to 9 and Comparative examples 1 to 3, and brightness of the β-SiAlON phosphors are listed in the following Table 2.

TABLE 2

| Ex. No. | Silicon raw materials | | Aluminum raw materials Kinds | Emission peak wavelength (nm) | Brightness (%) |
| --- | --- | --- | --- | --- | --- |
| | Kinds | $Si/Si_3N_4$ (parts by weight) | | | |
| Ex. 1 | $Si/Si_3N_4$ | 70/30 | $Al_2O_3$ | 541 | 127 |
| Ex. 2 | $Si/Si_3N_4$ | 90/10 | $Al_2O_3$ | 541 | 124 |
| Ex. 3 | $Si/Si_3N_4$ | 50/50 | $Al_2O_3$ | 541 | 124 |
| Ex. 4 | $Si/Si_3N_4$ | 30/70 | $Al_2O_3$ | 541 | 107 |
| Ex. 5 | Si | 100/0 | $Al_2O_3$ | 541 | 118 |
| Comp. ex. 1 | $Si_3N_4$ | 0/100 | $Al_2O_3$ | 541 | 100 |
| Ex. 6 | $Si/Si_3N_4$ | 50/50 | AlN | 540 | 113 |
| Ex. 7 | $Si/Si_3N_4$ | 30/70 | AlN | 538 | 115 |
| Ex. 8 | Si | 100/0 | AlN | 540 | 106 |
| Comp. ex. 2 | $Si_3N_4$ | 0/100 | AlN | 540 | 100 |
| Ex. 9 | $Si/Si_3N_4$ | 50/50 | Al | 540 | 119 |
| Comp. ex. 3 | $Si_3N_4$ | 0/100 | Al | 536 | 100 |

From the above results, it was revealed that the β-SiAlON phosphors prepared in Examples 1 to 9 and Comparative examples 1 to 3 are green-emitting phosphors since their emission peak wavelengths are about 540 nm. Test samples, which were obtained by mixing an aluminum raw material with $Al_2O_3$ at different ratios of Si to $Si_3N_4$, were used in Examples 1 to 5 and Comparative example 1. The brightness of each of the β-SiAlON phosphors prepared in Examples 1 to 5 was compared to that of the β-SiAlON phosphor of Comparative example 1 whose brightness was set to 100%. Test samples, which were obtained by mixing an aluminum raw material with AlN at different ratios of Si to $Si_3N_4$, were used in Examples 6 to 8 and Comparative example 2. The brightness of each of the β-SiAlON phosphors prepared in Examples 6 to 8 was compared to that of the β-SiAlON phosphor of Comparative example 2 whose brightness was set to 100%. Test samples, which were obtained by mixing an aluminum raw material with Al metal, were used in Example 9 and Comparative example 3. The brightness of the β-SiAlON phosphor prepared in Examples 9 was compared to that of the β-SiAlON phosphor of Comparative example 2 whose brightness was set to 100%.

From the above results, it was revealed that all the β-SiAlON phosphors of the Examples show more than 100% brightness, and have a higher brightness than the metal silicon-free phosphors of the Comparative examples. That is, when any one of aluminum oxide, aluminum nitride and aluminum metal is used as the aluminum raw material, it was revealed that the aluminum metal-containing phosphors of the Examples have a higher brightness than those of the aluminum metal-free phosphors of the Comparative examples. In particular, the β-SiAlON phosphors of Examples 1 to 3 have brightness from 124 to 127%, which is at least 20% higher than those of the phosphor of Comparative example 1. Therefore, it was revealed that it is possible to prepare a β-SiAlON phosphor having higher brightness in the use of the metallic silicon.

As described above, the method for preparing a β-SiAlON phosphor according to one exemplary embodiment of the present invention may be useful to prepare a β-SiAlON phosphor having a high brightness by using metallic silicon as some or all of the silicon raw material so as to prepare β-SiAlON phosphors.

Also, the method for preparing a β-SiAlON phosphor according to one exemplary embodiment of the present invention may be useful to manufacture more reliable LEDs in the use of the β-SiAlON phosphor since the particle size distribution of the β-SiAlON phosphor may be controlled to a desired level in the preparation of the β-SiAlON phosphor.

While the present invention has been shown and described in connection with the exemplary embodiments, it will be apparent to those skilled in the art that modifications and variations can be made without departing from the spirit and scope of the invention as defined by the appended claims.

What is claimed is:

1. A method for preparing a β-SiAlON phosphor, the method comprising:
weighing a silicon raw material, an aluminum raw material and an activator raw material in order to prepare a β-SiAlON phosphor represented by Formula: $Si_{(6-x)}Al_xO_yN_{(8-y)}$:$Ln_z$ (wherein Ln is a rare earth element, and the following requirements are satisfied: $0 < x \leqq 4.2$, $0 < y \leqq 4.2$, and $0 < z \leqq 1.0$;
mixing the starting materials to prepare a raw material mixture; and heating the raw material mixture in a nitrogen-containing atmospheric gas,
wherein the starting material comprise:
at host raw material including a silicon raw material including metallic silicon and optionally a silicon compound, and at least one aluminum raw material selected from the group consisting of metallic aluminum and aluminum compound, wherein at least one of the silicon raw material and the aluminum raw material contains both the metal and compound;
at least one activator raw material selected from the rare earth elements for activating the host raw material,
wherein the method further comprises the step of adjusting at least one of a mixture ratio of metallic silicon and silicon compound and a mixing ratio of metallic aluminum and aluminum compound to control the particle size distribution of the β-SiAlON phosphor, and
wherein the metallic silicon is in the form of powder and has an average particle diameter of 300 μm or less.

2. The method of claim 1, wherein the rare earth element comprises Eu or Ce.

3. The method of claim 1, wherein the silicon compound comprises at least one selected from the group consisting of silicon nitride and silicon oxide.

4. The method of claim 1, wherein the aluminum compound comprises at least one selected from the group consisting of aluminum nitride, aluminum oxide and aluminum hydroxide.

5. The method of claim 1, wherein the β-SiAlON phosphor has a peak wavelength of 500 to 570 nm.

6. The method of claim 1, wherein the nitrogen-containing atmospheric gas has an $N_2$ concentration of 90% or more.

7. The method of claim 1, wherein the nitrogen-containing atmospheric gas has a gas pressure of 0.1 to 20 MPa.

8. The method of claim 1, wherein the operation of heating the raw material mixture is performed at a temperature of 1850 to 2200° C.

* * * * *